(12) United States Patent
Sakurai

(10) Patent No.: US 6,765,236 B2
(45) Date of Patent: Jul. 20, 2004

(54) OPTICAL DEVICE AND METHOD FOR MANUFACTURING THE SAME, AND ELECTRONIC APPARATUS

(75) Inventor: Kazunori Sakurai, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/032,227

(22) Filed: Dec. 21, 2001

(65) Prior Publication Data

US 2002/0088987 A1 Jul. 11, 2002

(30) Foreign Application Priority Data

Dec. 26, 2000 (JP) .................................... 2000-395112

(51) Int. Cl.[7] .............................................. H01L 33/00
(52) U.S. Cl. ...................... 257/98; 257/432; 257/724
(58) Field of Search .......................... 257/99, 98, 432, 257/433, 434, 724, 680

(56) References Cited

U.S. PATENT DOCUMENTS

| 3,283,207 | A | * | 11/1966 | Klein | 257/99 |
| 3,508,100 | A | * | 4/1970 | Tillays et al. | 257/99 |
| 6,396,082 | B1 | * | 5/2002 | Fukasawa et al. | 257/98 |
| 2002/0088987 | A1 | * | 7/2002 | Sakurai | 257/99 |
| 2002/0134988 | A1 | * | 9/2002 | Ishinaga | 257/99 |

* cited by examiner

Primary Examiner—Mark V. Prenty
(74) Attorney, Agent, or Firm—Harness, Dickey & Pierce, P.L.C.

(57) ABSTRACT

An optical device includes a substrate having a through hole formed therein, and an optical element mounted on the substrate with its optical section being placed to face the through hole, and a light transmissive member disposed at the through hole. Light transmissive under-fill material is provided between the substrate and the optical element and between the light transmissive member and the optical element.

9 Claims, 3 Drawing Sheets

OPTICAL DEVICE AND METHOD FOR MANUFACTURING THE SAME, AND ELECTRONIC APPARATUS

BACKGROUND OF THE INVENTION

1. Technical Field of the Invention

The present invention relates to optical devices and methods for manufacturing the same, and electronic apparatuses using the same.

2. Prior Art

An optical device in which an optical element such as a solid imaging element is sealed therein is known. The optical element is mounted on a circuit substrate, and a light receiving section or a light emitting section of the optical element is disposed to face a through hole that is formed in the circuit substrate. Also, a cover glass is adhered to the circuit substrate in a manner to cover the through hole. In accordance with the conventional optical device, since a cover glass is adhered to the circuit substrate as described above, this causes a problem in which its thickness becomes large. Furthermore, when a lens is mounted in addition to the cover glass, the thickness of the optical device becomes much greater.

It is an object of the present invention to solve the problems described above, and to provide a thinner optical device and a method for manufacturing the same, and an electronic apparatus including the same.

SUMMARY OF THE INVENTION

An optical device in accordance with the present invention comprises a substrate in which a through hole is formed; an optical element mounted on the substrate and having an optical section being placed to face the through hole; and a light transmissive member disposed at the through hole. Since the light transmissive member is disposed at the through hole, the optical device can be made thinner, smaller and lighter.

In the optical device, light transmissive under-fill material may be provided between the substrate and the optical element and between the light transmissive member and the optical element. As a result, the under-fill material can prevent water penetration in optical sections.

In the optical device, a spacer may be interposed between the optical element and the light transmissive member. As a result, the light transmissive member is prevented from contacting the optical element, and position adjustment of the light transmissive member is possible.

In the optical device, the light transmissive member may be in the shape of a lens. As a result, the light transmissive member itself serves as a lens, and therefore the lens function can be added without increasing the thickness.

An optical device in accordance with the present invention comprises a substrate in which a through hole is formed; an optical element mounted on the substrate and having an optical section being placed to face the through hole; and a lens that is provided on the substrate and covers the through hole. Since the lens covers the through hole, a cover glass is not required, and the optical device can be made thinner, smaller and lighter.

In the optical device, light transmissive under-fill material may be provided between the substrate and the optical element and between the lens and the optical element. As a result, the under-fill material prevents water penetration into optical sections.

In the optical device, a spacer may be interposed between the substrate and the lens. As a result, the position of the lens can be adjusted according to a focal distance of the lens.

In the optical device, an electronic element other than the optical element may be mounted on the substrate.

An electronic apparatus in accordance with the present invention comprises the optical device described above.

A method for manufacturing an optical device in accordance with the present invention comprises the steps of mounting an optical element on a substrate in which a through hole is formed in a manner that an optical section thereof is placed to face the through hole; providing light transmissive under-fill material between the substrate and the optical element; and disposing a light transmissive member at the through hole.

Since the light transmissive member is disposed at the through hole, the optical device can be made thinner, smaller and lighter.

In the method for manufacturing an optical device, a space between the optical element and the light transmissive member may be regulated by a spacer. As a result, the light transmissive member is prevented from contacting the optical element, and positioning of the light transmissive member is possible.

In the method for manufacturing an optical device, the light transmissive member may be disposed at the through hole after the under-fill material is provided. As a result, since the under-fill material is provided in a state in which the through hole is opened, air can be removed, and generation of bubbles can be prevented.

In the method for manufacturing an optical device, the under-fill material may be provided after the light transmissive member is disposed at the through hole. As a result, the under-fill material can be prevented from flowing out from the through hole.

In the method for manufacturing an optical device, the light transmissive member may be disposed at the through hole after the optical element is mounted on the substrate. As a result, the light transmissive member can be left intact without being influenced when an optical element is mounted.

In the method for manufacturing an optical device, the optical element may be mounted on the substrate after the light transmissive member is disposed at the through hole. As a result, the optical element can be left intact without being influenced when the light transmissive member is disposed at the through hole.

A method for manufacturing an optical device in accordance with the present invention comprises the steps of mounting an optical element on a substrate in which a through hole is formed in a manner that an optical section thereof is placed to face the through hole, providing light transmissive under-fill material between the substrate and the optical element; and disposing a lens on the substrate in a manner to cover the through hole. Since the lens covers the through hole, a cover glass is not required, and the optical device can be made thinner, smaller and lighter.

In the method for manufacturing an optical device, a spacer may be provided between the substrate and the lens. As a result, the position of the lens can be adjusted according to a focal distance of the lens.

In the method for manufacturing an optical device, the lens may be provided after the under-fill material is provided. As a result, since the under-fill material is provided in a state in which the through hole is opened, air can be removed and generation of bubbles can be prevented.

In the method for manufacturing an optical device, the under-fill material may be provided after the lens is provided. As a result, the under-fill material can be prevented from flowing out from the through hole.

In the method for manufacturing an optical device, the lens may be mounted on the substrate after the optical element is mounted on the substrate. As a result, the lens can be left intact without being influenced when an optical element is mounted.

In the method for manufacturing an optical device, the optical element may be mounted on the substrate after the lens is mounted on the substrate. As a result, the optical element can be left intact without being influenced when a lens is mounted on the substrate.

DETAILED DESCRIPTION OF THE PREFERRED EMBODIMENTS

Preferred embodiments of the present invention are described below with reference to the accompanying drawings.

Figure 1:
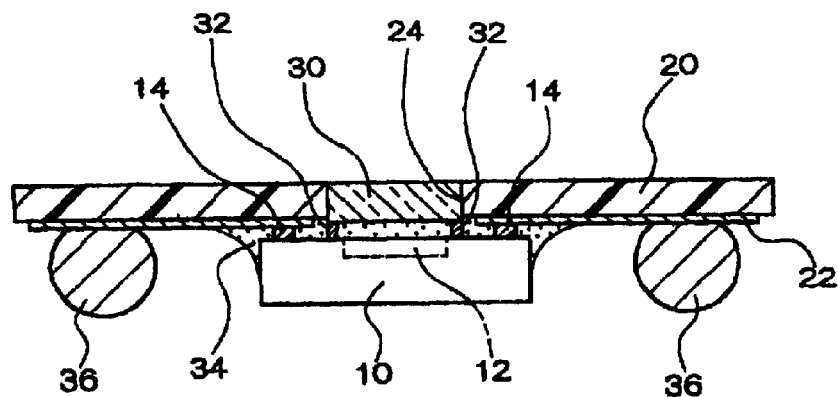
FIG. 1 shows an optical device in accordance with a first embodiment of the present invention.

FIG. 1 is an illustration showing an optical device in accordance with a first embodiment of the present invention. The optical device includes at least one (one or multiple) optical element 10. The optical device includes the packaged optical element 10. The optical element 10 has an optical section 12. The optical element 10 may be a light receiving element or a light emitting element. When the optical element 10 is a light emitting element, the optical section 12 is a light emitting section. When the optical element 10 is a light receiving element, the optical section 12 is a light receiving section.

In accordance with the present embodiment, the optical element 10 is an imaging element (image sensor). When it is a two-dimensional image sensor, the optical section 12 corresponds to a plurality of light receiving sections (for example, photo diodes) that compose a plurality of pixels. In the case of a CCD (charge coupled device) type imaging element, a transfer section not shown in the figure is provided to transfer charge from each light receiving section at each pixel at a high speed. In accordance with an embodiment different from the present embodiment, a surface light emitting element, in particular, a surface light emitting laser may be provided as a modified example of the optical element 10. The surface light emitting element such as a surface light emitting laser emits light in a direction perpendicular to the substrate that composes the element.

The optical element 10 may have at least one bump (a plurality of bumps in the present embodiment) 14 in order to provide electrical connection between the optical element 10 and the exterior. For example, the bumps 14 for providing electrical connection with the exterior may be provided on a surface in which the optical section 12 is formed. The bumps 14 are provided at positions where they can have electrical connection with other members. For example, the bumps 14 may be provided at locations that avoid a hole 24 in a substrate 20. The bumps 14 may preferably protrude compared to the optical section 12.

The optical device includes the substrate 20. The substrate 20 may have a low light transmissivity (or a light shielding characteristic). As the substrate 20, a silicon substrate or a glass epoxy substrate may be used. Alternatively, a flexible substrate or a film that is composed from polyimide resin may be used, or a multiple-layered substrate or a build-up substrate may be used. Through holes 24 are formed in the substrate 20. The through holes 24 are formed in the same number as the number of the optical sections 12. The through hole 24 is formed in a size that encircles the optical section 12.

A wiring pattern 22 is formed on the substrate 20. The wiring pattern 22 may be formed with a land as a region that is bonded to the optical element 10. The wiring pattern 22 may preferably be formed in a manner to avoid the through hole 24 in the substrate 20. Also, the wiring pattern 22 may preferably be covered by another member (for example, a resist not shown in the figure) as long as it does not prevent electrical connection. The wiring pattern 22 shown in FIG. 1 is formed on only one surface of the substrate 20. However, wiring patterns 22 can be formed on both surfaces of the substrate 20, and electrically connected to one anther through a through hole (not shown in the figure).

In accordance with the present embodiment, the optical element 10 is mounted on the substrate 20 such that a face-down structure is formed. The bump 14 of the optical element 10 and the wiring pattern 22 are connected to one another. If required, the optical element 10 and the wiring pattern 22 may be electrically connected by a wire not shown in the figure. The optical element 10 is mounted in a manner that its optical section 12 coincides with the through hole 24. In other words, the optical element 10 is mounted on the substrate 20 with its optical section 12 being disposed to face the through hole 24.

The optical device includes a light transmissive member 30. The light transmissive member 30 may have a higher light transmissivity than that of the substrate 20, or may be transparent. The light transmissive member 30 may be composed, for example, from glass or resin (plastics). The light transmissive member 30 may be a substrate or may be in a block shape. The light transmissive member 30 is disposed in the through hole 24 in the substrate 20. More specifically, the light transmissive member 30 may be pressure-inserted in the through hole 24, or may be disposed therein with a small clearance provided between them. Since the light transmissive member 30 is disposed in the through hole 24, the optical device can be made thinner, smaller and lighter.

When the thickness of the light transmissive member 30 is greater than the thickness of the substrate 20, it can be readily placed in the through hole 24. Also, the light transmissive member 30 may be provided in a manner that it does not protrude from a surface opposite to the surface of the substrate 20 on which the optical element 10 is mounted. In the example shown in FIG. 1, the surface of the substrate 20 is flush with the surface of the light transmissive member 30. By doing so, an increase in the thickness by the light transmissive member 30 can be avoided.

A spacer 32 may be provided between the light transmissive member 30 and the optical element 10. By providing the spacer 32, the space between the light transmissive member 30 and the optical element 10 can be regulated, and the light transmissive member 30 is prevented from contacting the optical section 12. The spacer 32 may have a light shielding characteristic. Also, the spacer 32 may be provided in a manner to encircle the optical section 12. When the spacer 32 and the substrate 20 has a light shielding characteristic, and the spacer 32 encircles the optical section 12, light can be prevented from entering the optical section 12 through a space between the optical element 10 and the substrate 20. In other words, light enters the optical section 12 only through the light transmissive member 30.

Under-fill material 34 is provided between the light transmissive member 30 and the optical element 10. The under-fill material 34 may be, for example, resin, and may be adhesive. The under-fill material 34 may have light transmissivity, and may preferably be transparent. In particular, the under-fill material 34 may preferably cover the optical section 12. By this, water content can be prevented from penetrating into the optical section 12 (or the surface where the optical section 12 in the optical element is formed). The under-fill material 34 is also provided between the substrate 20 and the optical element 10. Also, the under-fill material 34 forms a fillet. The under-fill material 34 alleviates stresses caused by a difference in the thermal expansion coefficient between the optical element 10 and the substrate 20.

As shown in FIG. 1, external terminals 36 may be provided. The external terminals 36 are for example solder balls, and are provided on the wiring pattern 22. Alternatively, a part of the wiring pattern 22 may be formed into a connector, or a connector may be mounted on the wiring pattern 22.

The optical device in accordance with the present embodiment is structured in a manner described above, and a method for manufacturing the same is described below. In accordance with the method for manufacturing an optical device, an optical element 10 is mounted on a substrate 20 in which a through hole 24 is formed with its optical section 12 being placed to face the through hole 24. Also, a light transmissive under-fill material 34 is provided between the substrate 20 and the optical element 10. Also, a light transmissive member 30 is disposed in the through hole 24. For example, the following embodiments can be provided.

The optical element 10 is mounted on the substrate 20 and the under-fill material 34 is provided, and thereafter the light transmissive member 30 is disposed in the through hole 24. In this case, the light transmissive member 30 may preferably be smaller than the through hole 24 so that it can be disposed in the through hole 24 with a clearance between them. Then, the light transmissive member 30 is adhered to the under-fill material 34 in the through hole 24. By this method, the under-fill material 34 is provided in a state in which the through hole 24 is open, such that air-removal is feasible and generation of bubbles can be avoided. Also, since the optical element 10 is mounted on the substrate 20 and then the light transmissive member 30 is provided, the light transmissive member 30 is not affected by the incident of mounting the optical element 10.

(2) After the optical element 10 is mounted on the substrate 20 and the light transmissive member 30 is disposed in the through hole 24, then the under-fill material 34 is provided. In this case, the spacer 32 may preferably be provided on the optical element 10 to support the light transmissive member 30. By this method, the under-fill material 34 is provided after the through hole 24 is closed by the light transmissive member 30. As a result, the under-fill material 34 can be prevented from flowing out from the through hole 24. Also, since the optical element 10 is mounted on substrate 20 and then the light transmissive member 30 is provided, the light transmissive member 30 is not affected by the incident of mounting the optical element 10.

(3) After the light transmissive member 30 is disposed in the through hole 24 and the optical element 10 is mounted on the substrate 20, then the under-fill material 34 is provided. In this case, the light transmissive member 30 may preferably be fixed within the through hole 24. In accordance with this method, the through hole 24 is closed by the light transmissive member 30, and then the under-fill material 34 is provided. As a result, the under-fill material 34 can be prevented from flowing out from the through hole 24. Also, since the light transmissive member 30 is disposed in the through hole 24, and then the optical element 10 is mounted on substrate 20, the optical element 10 is not affected by the incident of disposing the light transmissive member 30 in the through hole 24.

(4) After the light transmissive member 30 is disposed in the through hole 24 and the under-fill material 34 is provided, then the optical element 10 is mounted on the substrate 20. In this case, the under-fill material 34 is provided on at least one of the light transmissive member 30 disposed in the through hole 24 and the optical element 10. Also, the light transmissive member 30 may preferably be fixed within the through hole 24. In accordance with this method, the through hole 24 is closed by the light transmissive member 30, and then the under-fill material 34 is provided. As a result, the under-fill material 34 can be prevented from flowing out from the through hole 24. Also, since the light transmissive member 30 is disposed in the through hole 24, and then the optical element 10 is mounted on substrate 20, the optical element 10 is not affected by the incident of disposing the light transmissive member 30 in the through hole 24.

By the methods described above, thinner, smaller and lighter optical devicees can be manufactured. The present invention is not limited to the embodiments described above. Other embodiments are described below.

Figure 2:
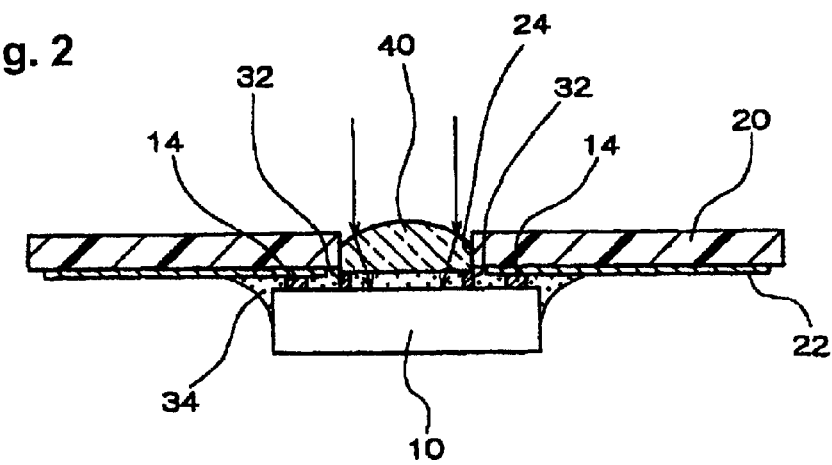
FIG. 2 shows an optical device in accordance with a second embodiment of the present invention.

FIG. 2 shows an optical device in accordance with a second embodiment of the present invention. In this embodiment, the light transmissive member 40 is in the shape of a lens. External terminals are not provided in the example shown in FIG. 2, but may be provided therein. Structures and manufacturing steps other than the above correspond to those described above in the first embodiment. In accordance with the present embodiment, light that enters the light transmissive member 40 can be converged. A spacer 32 may preferably be provided to correctly position the light transmissive member 40. Also, light may preferably be converged inside the spacer 32. The present embodiment can also achieve the effects described in connection with the first embodiment.

Figure 3:
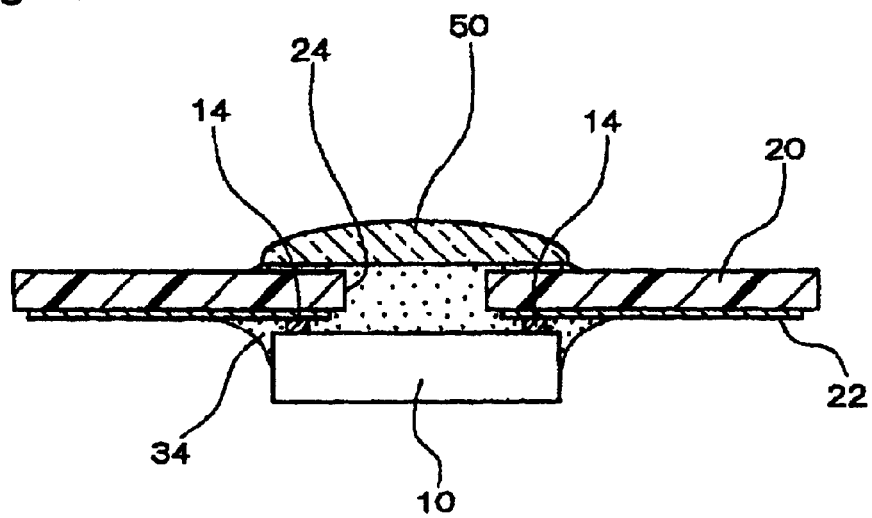
FIG. 3 shows an optical device in accordance with a third embodiment of the present invention.

FIG. 3 shows an optical device in accordance with a third embodiment of the present invention. The optical device in accordance with the present embodiment has a lens 50 that serves as a light transmissive member, and therefore it can converge light. Also, the lens 50 is larger than the through hole 24 in the substrate 20. The lens 50 is mounted on the substrate 20 in a manner to cover the through hole 24. The under-fill material 34 is provided between the substrate 20 and the optical element 10 and between the lens 50 and the optical element 10. It is noted that the under-fill material 34 shown in FIG. 3 may be used to adhere the lens 50 and the substrate 20 to one anther, or another adhesive may be used. In the present embodiment, although neither external terminal nor spacer is provided, they can be provided. Structures and manufacturing steps other than the above correspond to the contents described above with respect to the first embodiment. In accordance with the present embodiment, since the through hole 24 is closed by the lens 50, a cover glass is not required, such that the optical device can be made thinner, smaller and lighter.

In the method for manufacturing the optical device in accordance with the present embodiment, the lens 50 is provided on the substrate 20, instead of a light transmissive member 30 disposed in a through hole 24 as provided in the first embodiment. The contents described with reference to the first embodiment are applicable to the details therefor.

Figure 4:
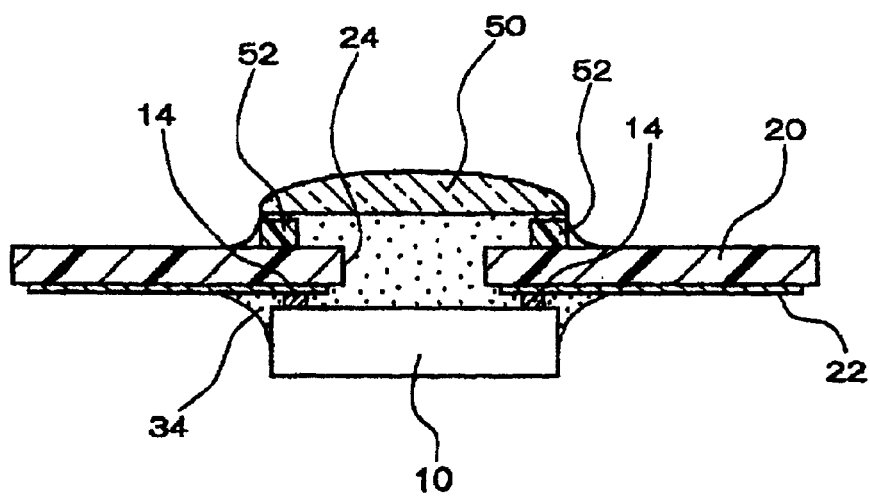
FIG. 4 shows a modified example of the third embodiment of the present invention.

In a modified example of the present embodiment, a spacer 52 may be provided between the lens 50 and the substrate 20, as shown in FIG. 4. The lens 50 can be located at a position according to its focal distance.

Figure 5:
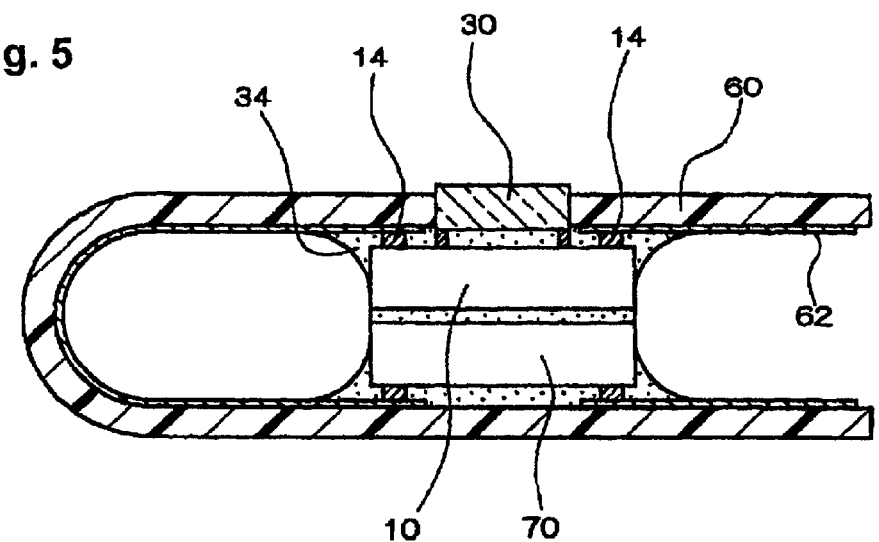
FIG. 5 shows an optical device in accordance with a fourth embodiment of the present invention.

FIG. 5 shows an optical device in accordance with a fourth embodiment of the present invention. The optical device of the present embodiment is provided with at least one (one or plural) electronic part 70 in addition to an optical element 10 mounted on a substrate 60. The electronic part 70 may be any one of a passive element (resistor, capacitor, inductor), an active element (semiconductor element, integrated circuit), a connection part (switch, wiring plate), a functional part (filter, oscillator, delay line), and a conversion part (sensor). The electronic part 70 may be a driver IC for driving the optical element 10. The electronic part 70 shown in FIG. 5 is a face-mounting type part, but may be a lead-mounting part. The mounting structure of the electronic part 70 is not particularly limited, and it can be either a face-down structure or a face-up structure. Wiring patterns 62 electrically connect the optical element 10 and the electronic part 70.

As shown in FIG. 5, the substrate 60 may be curved. In this case, a flexible substrate may be used as the substrate 60. Also, the optical element 10 and the electronic part 70 may be adhered to one another. For example, a surface of the optical element 10 opposite to its surface to be mounted on the substrate 60 may be adhered to a surface of the electronic part 70 opposite to its surface to be mounted on the substrate 60. Alternatively, the substrate 60 may be bent, and portions of its opposing surfaces may be adhered to one another to maintain the substrate 60 in a bent state. Adhesive may be used for the adhesion.

The contents described above with respect to the first through third embodiments are applicable to the present embodiment. The optical device in accordance with the present embodiment can also be made thinner, smaller and lighter.

Figure 6:
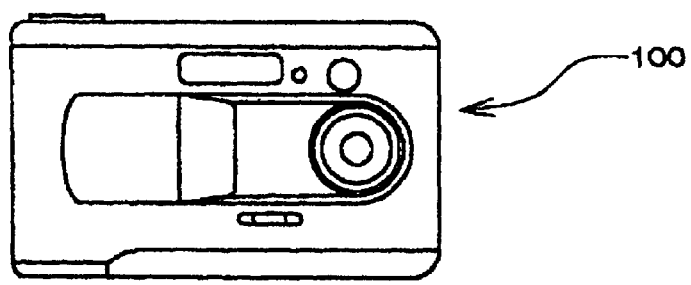
FIG. 6 shows an electronic apparatus having an optical device in which the present invention is applied.

FIG. 6 shows a digital camera 100 as one example of electronic apparatus having an optical device in which the present invention is implemented.

The entire disclosure of Japanese Patent Application No. 2000-395112(P) filed Dec. 26, 2000 is incorporated by reference herein.

What is claimed is:

1. An optical device comprising:

a substrate including a through hole;

an optical element mounted on the substrate and having an optical section placed to face the through hole; and a light transmissive member disposed at the through hole;

wherein light transmissive under-fill material is provided between the substrate and the optical element and between the light transmissive member and the optical element and a spacer is disposed in the under-fill material.

2. An optical device comprising:

a substrate including a through hole;

an optical element mounted on the substrate and having an optical section placed to face the through hole; and a light transmissive member disposed at the through hole;

wherein a spacer is interposed between the optical element and the light transmissive member, the spacer regulating a space between the optical element and the light transmissive member.

3. An optical device according to claim 1, wherein the light transmissive member is in a lens shape.

4. An optical device comprising:

a substrate including a through hole;

an optical element mounted on the substrate and having an optical section placed to face the through hole; and a lens provided on the substrate and covering the through hole, wherein light transmissive under-fill material is provided between the substrate and the optical element and between the lens and the optical element and a spacer is disposed in the under-fill material.

5. An optical device comprising:

a substrate including a through hole;

an optical element mounted on the substrate and having an optical section placed to face the through hole; and a lens provided on the substrate and covering the through hole, wherein a spacer is interposed between the substrate and the lens.

6. An optical device according to claim 2, wherein the light transmissive member is in a lens shape.

7. An optical device comprising:

a substrate having an upper surface and a lower surface opposite the upper surface, the substrate including a through hole;

an optical element adhered to the lower surface of the substrate and having an optical section facing the through hole; and a lens shaped light transmissive member mounted in the through hole;

wherein an upper end of a side surface of the light transmissive member is recessed within the through hole relative to the upper surface of the substrate.

8. An optical device comprising:

a flexible substrate including a through hole;

an optical element mounted on the substrate and having an optical section placed to face the through hole; and a light transmissive member disposed at the through hole;

wherein the flexible substrate is bent, an electronic element other than the optical element is mounted on the flexible substrate, and a surface of the optical element is adhered to a surface of the electronic element.

9. An optical device according to claim 8, wherein light transmissive under-fill material is provided between the flexible substrate and the optical element and between the light transmissive member and the optical element and a spacer is disposed in the under-fill material.

* * * * *